United States Patent
Kinoshita et al.

(10) Patent No.: US 7,608,381 B2
(45) Date of Patent: Oct. 27, 2009

(54) POLYMER COMPOUND, POSITIVE RESIST COMPOSITION AND PROCESS FOR FORMING RESIST PATTERN

(75) Inventors: Yohei Kinoshita, Kawasaki (JP); Takeshi Iwai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 125 days.

(21) Appl. No.: 11/570,761

(22) PCT Filed: Jun. 10, 2005

(86) PCT No.: PCT/JP2005/010697

§ 371 (c)(1),
(2), (4) Date: Dec. 15, 2006

(87) PCT Pub. No.: WO2005/123795

PCT Pub. Date: Dec. 29, 2005

(65) Prior Publication Data

US 2008/0096126 A1    Apr. 24, 2008

(30) Foreign Application Priority Data

Jun. 18, 2004   (JP) ............... 2004-181070
Oct. 29, 2004   (JP) ............... 2004-316959

(51) Int. Cl.
*G03F 7/039* (2006.01)
*G03F 7/20* (2006.01)
*G03F 7/30* (2006.01)

(52) U.S. Cl. ............... 430/270.1; 430/910; 430/326; 430/914; 526/270; 526/266; 526/280; 526/282; 526/284

(58) Field of Classification Search ............... 430/270.1, 430/281.1
See application file for complete search history.

(56) References Cited

U.S. PATENT DOCUMENTS 6,083,659 A    7/2000    Choi (Continued)

FOREIGN PATENT DOCUMENTS

| JP | 01130864 A | 5/1989 |
| JP | 04039665 A | 2/1992 |
| JP | 2003147023 A | 5/2003 |
| JP | 2004151364 A | 5/2004 |
| JP | 2004256562 A | 9/2004 |
| JP | 2005146252 A | 6/2005 |
| TW | I263866 | 10/2006 |
| TW | I285793 | 8/2007 |

OTHER PUBLICATIONS

Ogata, Toshiyuki., Matsumaru,. S., Shimizu, H. Kubota, N., Hada, H. and Shirai, M. Effects of Protecting Group on Resist Characteristics of Acryl Polymers for 193 mn Lithography. Jun. 2004, Journal of Photopolymer Science and Technology, vol. 17, No. 4. pp. 483-488.*
Notice/Search Report dated Dec. 31, 2007 in corresponding Taiwanese Application No. 094119865.

*Primary Examiner*—Sin J. Lee
(74) *Attorney, Agent, or Firm*—Knobbe, Martens, Olson and Bear, LLP

(57) ABSTRACT

The positive resist composition of the present invention is a polymer compound comprising at least one constituent unit (a1) selected from the group consisting of constituent units represented by the following general formulas (1) and (1)', a constituent unit (a2) derived from an (α-lower alkyl)acrylate ester having a lactone-containing monocycle or a polycyclic group, and a constituent unit (a3) which is a constituent unit other than the constituent unit (a1) and the constituent unit (a2) and is derived from an (α-lower alkyl)acrylate ester which has an aliphatic cyclic group-containing non-acid dissociable dissolution inhibiting group and does not have a polar group:

[Chemical Formula 1]

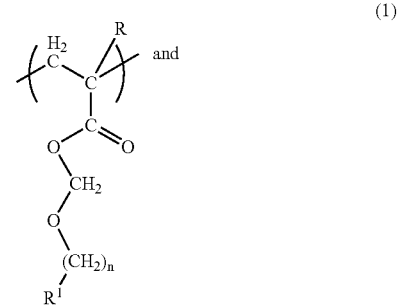

(1)

[Chemical Formula 2]

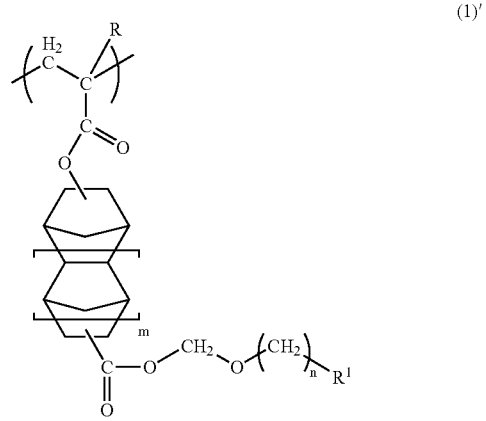

(1)' wherein R represents a hydrogen atom, a fluorine atom, a lower alkyl group having 20 or less carbon atoms, or a fluorinated lower alkyl group having 20 or less carbon atoms, $R^1$ represents at most 20-membered cyclic group which may have a substituent, n represents 0 or an integer of 1 to 5, and m represents 0 or 1.

19 Claims, No Drawings

U.S. PATENT DOCUMENTS

| | | |
|---|---|---|
| 6,517,991 B1 * | 2/2003 | Kodama et al. .......... 430/270.1 |
| 6,548,221 B2 | 4/2003 | Uetani et al. |
| 6,749,989 B2 | 6/2004 | Hada et al. |
| 2003/0087183 A1 * | 5/2003 | Nishi et al. .............. 430/270.1 |
| 2005/0106499 A1 | 5/2005 | Harada et al. |
| 2005/0227174 A1 * | 10/2005 | Hatakeyama et al. .... 430/270.1 |

* cited by examiner

POLYMER COMPOUND, POSITIVE RESIST COMPOSITION AND PROCESS FOR FORMING RESIST PATTERN

TECHNICAL FIELD

The present invention relates to a polymer compound, a positive resist composition, and a process for forming a resist pattern.

This application claims priority from Japanese Patent Application No. 2004-181070 filed on Jun. 18, 2004 and Japanese Patent Application No. 2004-316959 filed on Oct. 29, 2004, the disclosure of which is incorporated by reference herein.

BACKGROUND ART

In the production of semiconductor devices and liquid crystal displays, rapid progress has recently been made in fining of the size of them with the progress of a lithography technology. As a technique for fining of the size, shortening of the wavelength of an exposure light source is generally performed. Specifically, while ultraviolet rays typified by g-ray and i-ray have conventionally been used, KrF excimer laser (248 nm) is popularly used for mass production at present and ArF excimer laser (193 nm) begins to be introduced for mass production. Also a lithography technology using $F_2$ excimer laser (157 nm), EUV (extreme ultraviolet ray) and EB (electron beam) as a light source (radiation source) has been studied.

To a resist for a light source having a short wavelength, high resolution capable of reproducing a pattern having a fine size and high sensitivity to the light source having a short wavelength are required. As one resist which satisfies these conditions, a chemically amplified photoresist comprising a base resin and an acid generator which generates an acid upon exposure (hereinafter referred to as PAG) is known and the chemically amplified photoresist includes a positive photoresist in which alkali solubility of the exposed area increases and a negative photoresist in which alkali solubility of the exposed area decreases.

As a base resin of the chemically amplified photoresist, there has hitherto been used a resin (PHS-based resin) in which a hydroxyl group of polyhydroxystyrene (PHS) having high transparency to KrF excimer laser (248 nm) is protected with an acid dissociable dissolution inhibiting group. However, the PHS-based resin has an aromatic ring such as benzene ring and is therefore insufficient in transparency to light having a wavelength shorter than 248 nm, for example, 193 nm. Therefore, the chemically amplified photoresist containing the PHS-based resin as a base resin component had such a drawback that it shows low resolution in the process using light having a wavelength of 193 nm.

Therefore, as the base resin of the resist in ArF excimer laser lithography, a resin (acrylic resin) comprising a constituent unit derived from a (meth)acrylate ester in a main chain is mainly used because it is excellent in transparency to light having a wavelength of about 193 nm. As disclosed in Japanese Patent 2,881,969, as the acid dissociable dissolution inhibiting group, a constituent unit derived from a tertiary ester compound of (meth)acrylic acid, for example, 2-alkyl-2-adamanthyl (meth)acrylate is generally used. The constituent unit is known that the acid dissociable dissolution inhibiting group has high elimination energy.

DISCLOSURE OF THE INVENTION

By the way, as a resin having an acid dissociable dissolution inhibiting group use in ArF excimer laser lithography, an intense interest has recently been shown towards a resin comprising a constituent unit in which the acid dissociable dissolution inhibiting group has higher elimination energy than that of the tertiary ester compound, and a hydrogen atom of (meth)acrylic acid is substituted with an acetal group (alkoxyalkyl group). Although a fine pattern can be formed by using the resin comprising the constituent unit, there is a problem such as pattern collapse of a resist pattern and an improvement is required.

Under these circumstances, the present invention has been made and an object thereof is to provide a polymer compound which has high resolution and high sensitivity, and also can form a resist pattern in which pattern collapse is suppressed, a positive resist composition containing the polymer compound, and a process for forming a resist pattern.

The present inventors have intensively studied and found that the above object can be achieved by using a polymer compound comprising specific three kinds of constituent units and a positive resist composition containing the polymer compound, and thus the present invention has been completed.

According to a first aspect of the present invention, there is provided a polymer compound comprising:

at least one constituent unit (a1) selected from the group consisting of constituent units represented by the following general formulas (1) and (1)':

[Chemical Formula 1]

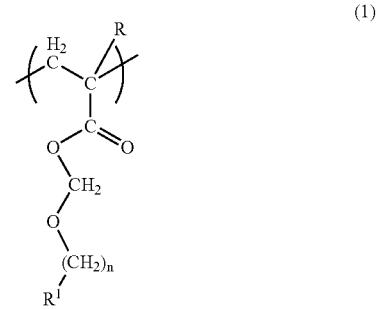

wherein R represents a hydrogen atom, a fluorine atom, a lower alkyl group having 20 or less carbon atoms, or a fluorinated lower alkyl group having 20 or less carbon atoms, $R^1$ represents at most 20-membered cyclic group which may have a substituent, and n represents 0 or an integer of 1 to 5, and

[Chemical Formula 2] (1)'

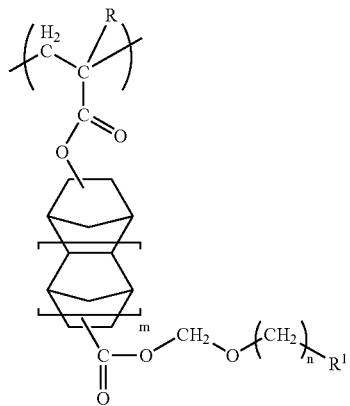

wherein R represents a hydrogen atom, a fluorine atom, a lower alkyl group having 20 or less carbon atoms, or a fluorinated lower alkyl group having 20 or less carbon atoms, $R^1$ represents at most 20-membered cyclic group which may have a substituent, n represents 0 or an integer of 1 to 5, and m represents 0 or 1, a constituent unit (a2) derived from an (α-lower alkyl) acrylate ester having a lactone-containing monocycle or a polycyclic group, and a constituent unit (a3) which is a constituent unit other than the constituent unit (a1) and the constituent unit (a2) and is derived from an (α-lower alkyl)acrylate ester which has an aliphatic cyclic group-containing non-acid dissociable dissolution inhibiting group and does not have a polar group.

According to a second aspect of the present invention, there is provided a positive resist composition comprising the polymer compound of the first aspect as a base material resin component (A), and an acid generator (B) which generates an acid upon irradiation with radiation.

According to a third aspect of the present invention, there is provided a process for forming a resist pattern comprising the steps of forming a resist film on a substrate using the positive resist composition of the second aspect, exposing the resist film, and developing the resist film to form a resist pattern.

In the present invention, a "constituent unit" means a monomer unit constituting a polymer.

In the present invention, an "(α-lower alkyl)acrylic acid" means either or both of an α-lower alkylacrylic acid such as methacrylic acid, and acrylic acid. As used herein, the "α-lower alkylacrylic acid" means those in which a hydrogen atom connected to an α carbon atom of acrylic acid is substituted with a lower alkyl group. The "(α-lower alkyl)acrylate ester" is also as defined above.

Also a "constituent unit derived from an (α-lower alkyl) acrylate ester" means a constituent unit constituted by cleavage of an ethylenical double bond of the (α-lower alkyl) acrylate ester.

Also "exposure" constitutes a concept including entire irradiation with radiations.

In Claims and Description of the present patent, an "alkyl group" may be linear or branched chain unless otherwise specified.

According to the present invention, there is provided a polymer compound which is excellent in resolution and sensitivity, and also can form a resist pattern in which pattern collapse is suppressed, a positive resist composition, and a process for forming a resist pattern.

BEST MODE FOR CARRYING OUT THE INVENTION

The present invention will now be described in more detail.

<First Aspect: Polymer Compound>

The polymer compound of the present invention comprises:

at least one constituent unit (a1) selected from the group consisting of constituent units represented by the following general formulas (1) and (1)', a constituent unit (a2) derived from an (α-lower alkyl) acrylate ester having a lactone-containing monocycle or a polycyclic group, and a constituent unit (a3) which is a constituent unit other than the constituent unit (a1) and the constituent unit (a2) and is derived from an (α-lower alkyl)acrylate ester which has an aliphatic cyclic group-containing non-acid dissociable dissolution inhibiting group and does not have a polar group.

[Constituent Unit (a1)]

In the general formula (1) or the general formula (1)', R represents a hydrogen atom, a fluorine atom, a lower alkyl group having 1 to 20 carbon atoms (preferably 1 to 10 carbon atoms), or a fluorinated lower alkyl group having 1 to 20 carbon atoms (preferably 1 to 10 carbon atoms). In the fluorinated lower alkyl group, a portion of all of a hydrogen atom of the alkyl group may be substituted with a fluorine atom.

R is more preferably a linear or branched alkyl group having 1 to 5 carbon atoms, and examples thereof include methyl group, ethyl group, propyl group, isopropyl group, n-butyl group, isobutyl group, tert-butyl group, pentyl group, isopentyl group, and neopentyl group. From an industrial point of view, a methyl group is preferable.

n is 0 or an integer of 1 to 5, preferably 0 or an integer of 1 to 2, and more preferably 0 or an integer of 1.

$R^1$ is at most 20-membered (the number of carbon atoms constituting a basic ring excluding a substituent is 20 or less) mono- or polycylic cyclic group, and is a 3- or multimembered cyclic group, although the lower limit is not specifically limited. In $R^1$, a substituent may be connected to the basic ring. When it has the substituent, a polar group such as hydroxyl group, carboxy group, or cyano group is preferable. Among these groups, a hydroxyl group and a carboxy group are preferable, and a hydroxyl group is particularly preferable. $R^1$ may have a carbonyl group (C=O).

In $R^1$, the basic ring may be a heterocyclic group having a hetero atom such as oxygen or nitrogen, or may be an alicyclic group. Oxygen- and/or nitrogen-containing heterocyclic groups and alicyclic groups are preferable, and an alicyclic group is particularly preferable.

In $R^1$, as the basic ring, for example, a mono- or polycyclic aliphatic cyclic group, which has conventionally been known as an ArF positive resist material, can be used. The "aliphatic" used herein means that it has no aromatic properties.

Examples of preferable monocyclic aliphatic cyclic group include groups in which one or two hydrogen atoms are eliminated from a monocycloalkane such as cyclohexane or cyclopentane. Examples of the polycyclic aliphatic cyclic group include groups in which one or two hydrogen atoms are eliminated from a polycycloalkane such as bicycloalkane, tricycloalkane, or tetracycloalkane, and specific examples thereof include groups in which one or two hydrogen atoms are eliminated from a polycycloalkane such as adamantane, norbornane, isobornane, tricyclodecane, or tetracyclododecane.

Furthermore, —CH$_2$—O—(CH$_2$)$_n$—R$^1$ in the general formula (1) or (1)' is preferably a structure represented by the following chemical formula:

[Chemical Formula 3]

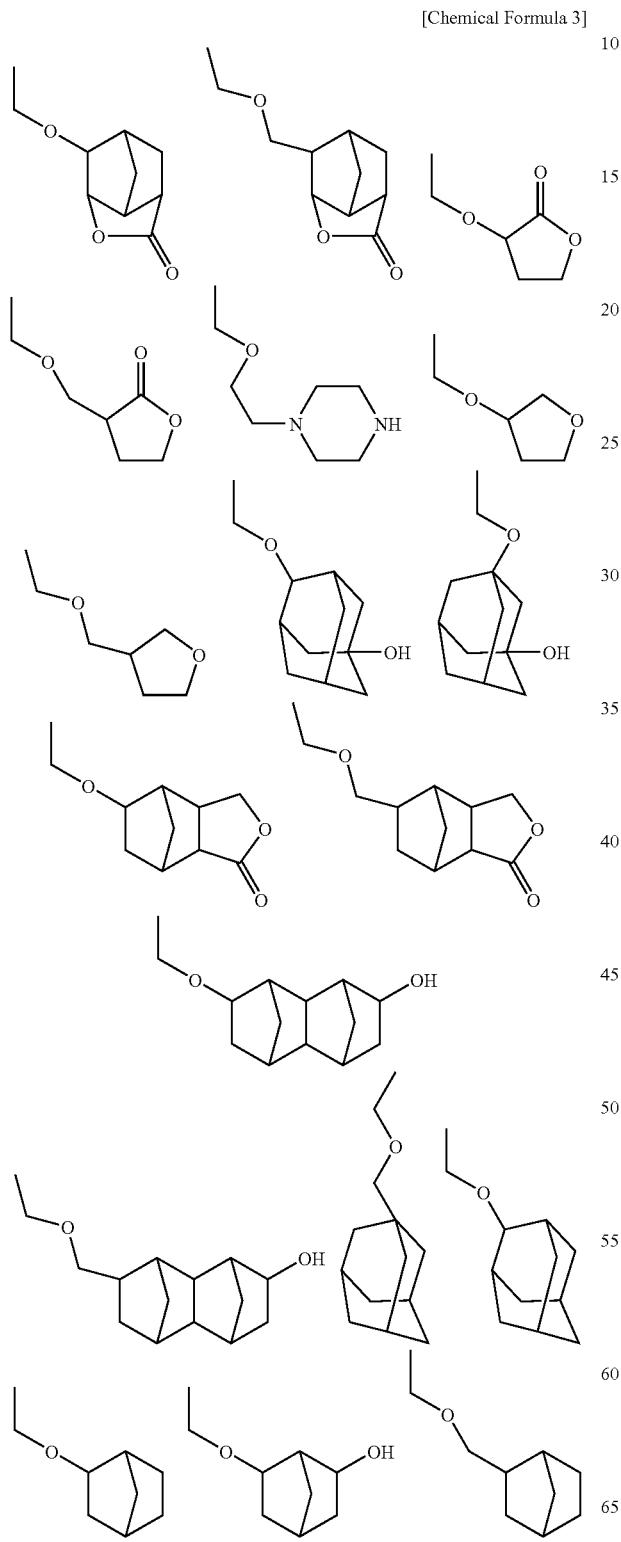

-continued

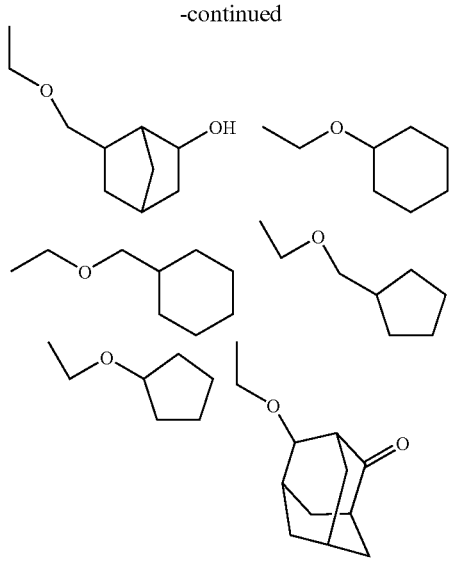

The constituent unit (a1) is preferably a constituent unit represented by the general formula (1), and more preferably a constituent unit represented by the following general formula (2):

[Chemical Formula 4]

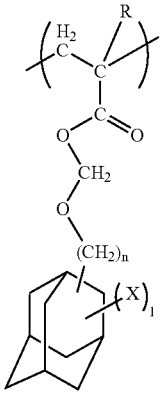

(2)

wherein R and n are as defined above, X is a polar group, and l represents 0 or an integer of 1 to 3.

X is preferably a hydroxyl group or a carboxy group. X is not limited to a monovalent group and is also preferably an oxygen atom (=O; the oxygen atom is combined with a carbon atom constituting a ring to form a carbonyl group). l is 0 or 1, and preferably 0, Similar to the case where X is 0, X is also preferably an oxygen atom and, at this time, l is preferably 1.

Among constituent units represented by the general formula (2), constituent units represented by the following general formulas (3) to (4) and (3)' are most preferable, and constituent units represented by the general formulas (3) and (3)' are preferable because resolution and resist pattern shape become excellent. It is also preferable because exposed area dependence becomes excellent. It is preferable because excellent resolution and resist pattern shape can be obtained even on an inorganic substrate such as SiON substrate.

Exposed area margin means the degree in which a resist shape or dimension does not vary depending on a coating rate of a mask or intracellular coordinates (position of the peripheral portion or the center portion in cells of the apparatus).

It is considered that, since an acetal type protective group of the present invention has very low deprotection energy and the deprotection reaction proceeds only by exposure energy, an influence of diffusion or deactivation of an acid is hardly exerted and thus the exposed area margin is improved.

[Chemical Formula 5]

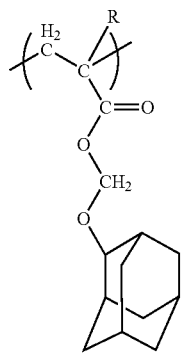

(3)

wherein R is as defined above

[Chemical Formula 6]

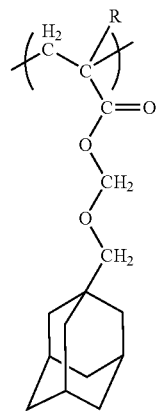

(4)

wherein R is as defined above

[Chemical Formula 7]

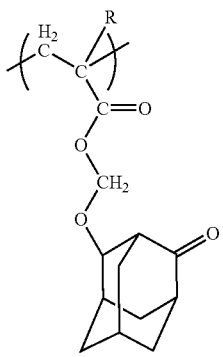

(3)′ wherein R is as defined above

The constituent unit (a1) has such a merit that a fine pattern can be resolved even in the case of a weak acid strength because deprotection energy is lower than that of a protective group of a tertiary ester, for example, 2-alkyl-2-adamanthyl group.

There is such a merit that the strength of the acid serving as a catalyst can be decreased because of low deprotection energy, and thus applicability of an acid generator can be widen.

For example, it is also possible to dissociate even by a diazomethane-based acid generator or an acid generator having camphorsulfonic acid ions in the anion moiety.

The constituent units (a1) may be used alone or in combination thereof.

In the polymer compound of the present invention, the content of the constituent unit (a1) is preferably from 10 to 80 mol %, more preferably from 20 to 60 mol %, and most preferably from 25 to 50 mol %, based on the sum of all constituent units of the polymer compound of the present invention. When the content is the lower limit or more, a fine pattern can be obtained when a resist composition is prepared. When the content is the upper limit or less, it is possible to attain a good balance with the other constituent units.

[Constituent Unit (a2)]

The polymer compound of the present invention contains, in addition to the constituent unit (a1), a constituent unit (a2) derived from an (α-lower alkyl)acrylate ester having a lactone-containing monocycle or a polycyclic group.

Consequently, adhesion between the resist film and the substrate is enhanced and pattern collapse and film peeling do not occur with ease in a fine resist pattern. Also hydrophilicity of the polymer compound is enhanced and affinity with the developing solution is enhanced, and thus alkali solubility in the exposed area is improved, resulting in improvement of resolution.

When the constituent unit (a2) is an α-lower alkyl acrylate ester, a lower alkyl group connected to an carbon atom, for example, R' may be linear or branched chain and an alkyl group having 1 to 5 carbon atoms is preferable. Examples thereof include methyl group, ethyl group, propyl group, isopropyl group, n-butyl group, isobutyl group, pentyl group, isopentyl group, and neopentyl group, and a methyl group is preferable.

The constituent unit (a2) includes a constituent unit in which a monocyclic group comprising a lactone ring or a polycyclic group having a lactone ring and an alicyclic group connected thereto is connected to the ester side chain moiety of the (α-lower alkyl)acrylate ester.

The lactone ring means one ring having a —O—C(O)- structure and this ring is counted as a first ring. Therefore, it is referred to as a monocyclic group in the case of only a lactone ring, while it is referred to a polycyclic group regardless of the structure when it has the other ring structure.

Specific examples of the lactone-containing monocycle or polycyclic group include monocyclic group in which one hydrogen atom is eliminated from γ-butyrolactone, and polycyclic group in which one hydrogen atom is eliminated from lactone ring-containing bicycloalkane, lactone ring-containing tricycloalkane and lactone ring-containing tetracycloalkane.

Specific examples thereof include a constituent unit derived from an (α-lower alkyl)acrylate ester having a monocyclic group comprising a monocyclic lactone ring, such as constituent unit represented by the general formula (5), and a constituent unit derived from an (α-lower alkyl)acrylate ester having a polycyclic group having a lactone ring, such as constituent units represented by the formulas (6) to (9):

[Chemical Formula 8]

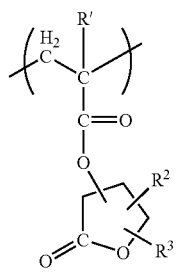

(5)

[Chemical Formula 11]

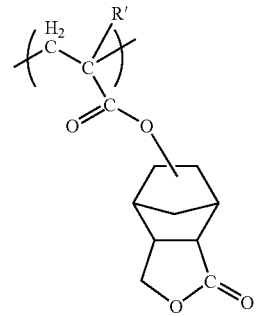

(8)

wherein R' is as defined above, and

[Chemical Formula 12]

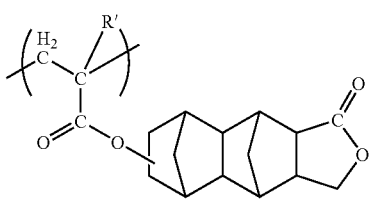

(9)

wherein R' is as defined above.

in the formula (5), R' represents a lower alkyl group or a hydrogen atom, and $R^2$ and $R^3$ each independently represents a hydrogen atom or lower alkyl group,

[Chemical Formula 9]

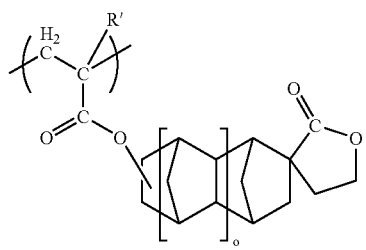

(6)

wherein R' is as defined above, and o is 0 or 1,

[Chemical Formula 10]

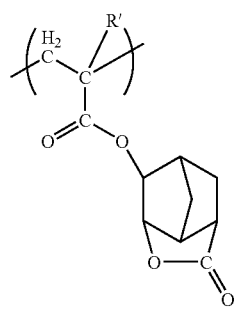

(7)

wherein R' is as defined above,

In the general formula (5), R' is the same lower alkyl group as that described about the α-lower alkyl acrylate ester.

$R^2$ and $R^3$ each independently represents a hydrogen atom or lower alkyl group, and a hydrogen atom is preferably a hydrogen atom because it is industrially available.

The lower alkyl group as for $R^2$ and $R^3$ may be linear or branched, and an alkyl group having 1 to 5 carbon atoms is preferable and specific examples thereof include methyl group, ethyl group, propyl group, isopropyl group, n-butyl group, isobutyl group, pentyl group, isopentyl group, and neopentyl group.

Among these constituent units represented by the general formulas (5) to (9), a constituent unit derived from a γ-butyrolactone ester of an (α-lower alkyl)acrylic acid represented by the general formula (5), namely, a (α-lower alkyl))acrylate ester of γ-butyrolactone is preferable in view of excellent effect of suppressing or reducing the proximity effect.

A constituent unit derived from a norbornanelactone ester of (α-lower alkyl))acrylic acids represented by the general formulas (7) and (8), namely, a (meth)acrylate ester of norbornanelactone is preferable because the resulting resist pattern is more excellent in shape, for example, rectangularity. Among these constituent units represented by the general formulas (5) to (9), a constituent unit represented by the general formula (5) is most preferable in view of the effects of the present invention. Furthermore, a constituent unit derived from a γ-butyrolactone ester of an (α-lower alkyl)acrylic acid having an ester bond at a carbon on a lactone skeleton in which $R^2$ and $R^3$ represent a hydrogen atom, namely, an (α-lower alkyl)acrylate ester of γ-butyrolactone is most preferable.

These constituent units (a2) may be used alone or in combination.

In the polymer compound of the present invention, the content of the constituent unit (a2) is preferably from 10 to 80 mol %, more preferably from 20 to 60 mol %, and most preferably from 25 to 50 mol %, based on the sum of all constituent units of the polymer compound. When the content is the lower limit or more, excellent effects of the present invention are exerted. When the content is the upper limit or less, it is possible to attain a good balance with the other constituent units.

[Constituent Unit (a3)]

The constituent unit (a3) is a constituent unit other than the constituent unit (a1) and the constituent unit (a2) and is derived from an (α-lower alkyl)acrylate ester which has an aliphatic cyclic group-containing non-acid dissociable dissolution inhibiting group and does not have a polar group.

The α-lower alkyl group and R' described hereinafter are the same as those described about the constituent unit (a2).

The constituent unit derived from an (α-lower alkyl)acrylate ester having an aliphatic cyclic group-containing non-acid dissociable dissolution inhibiting group is a constituent unit which having a function of increasing entire hydrophobicity of the component (A) before and after exposure, thereby suppressing alkali solubility.

The aliphatic cyclic group-containing non-acid dissociable dissolution inhibiting group is a group which has a cyclic group having no aromatic properties, and is not dissociated by an acid generated from the component (B). Examples of the constituent unit (a3) include a unit in which the aliphatic cyclic group-containing non-acid dissociable dissolution inhibiting group is connected with the ester moiety of the (α-lower alkyl)acrylate ester.

Namely, the constituent unit (a3) is a constituent unit having a group having dissolution inhibiting properties which reduces alkali solubility of the entire component (A) before exposure, and also reduces alkali solubility of the entire component (A) so as not to make it to be insoluble in an alkali when the entire component (A) is made to be soluble in an alkali by dissociation of an acid dissociable dissolution inhibiting group of the constituent unit (a1) without being dissociated by an action of an acid generated from the component (B) after exposure.

Specifically, it is a unit which can improve a contact angle (improvement in hydrophobicity) to pure water rinsing after PEB (post exposure baking treatment).

It is necessary that the constituent unit (a3) has not a polar group. The polar group is, for example, a hydroxyl group, a carboxy group, or a cyano group.

It is preferable that the constituent unit (a3) does not have an acid dissociable dissolution inhibiting group.

Specifically, the constituent unit (a3) is a constituent unit represented by the following general formula (10):

[Chemical Formula 13]

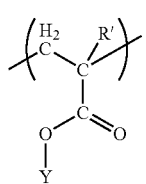

(10)

wherein R' is as defined above, and Y represents an aliphatic cyclic group whose basic ring has 4 to 15 carbon atoms, which may have 1 to 3 alkyl groups having 1 to 10 carbon atoms.

Y is an aliphatic cyclic group whose basic ring (ring structure in which a substituent is eliminated) has 4 to 15 carbon atoms (which may be monocylic or polycyclic), and the aliphatic cyclic group may have 1 to 3 alkyl groups having 1 to 10 carbon atoms. As used herein, the "aliphatic" means that it has no aromatic properties. The aliphatic cyclic group is preferably an alicyclic group.

The alkyl group, which may be included in Y, is an alkyl group having 1 to 10 carbon atoms, preferably a linear or branched alkyl group having 1 to 5 carbon atoms, and examples thereof include methyl group, ethyl group, propyl group, isopropyl group, n-butyl group, isobutyl group, pentyl group, isopentyl group, and neopentyl group. In Y, the number of the alkyl groups is preferably 0 or 1, and more preferably 0.

The constituent unit (a3) does not overlap with the constituent unit (a1) and the constituent unit (a2). Namely, it does not have any group, such as specific acid dissociable dissolution inhibiting group in the constituent unit (a1) and lactone group in the constituent unit (a2).

In the constituent unit (a3), as the cyclic group constituting a basic skeleton of the aliphatic cyclic group, it is possible to use a mono- or polycyclic aliphatic cyclic group which has conventionally been used as an ArF positive resist material.

Examples of the monocyclic aliphatic cyclic group include groups in which one or two or more hydrogen atoms are eliminated from a monocycloalkane such as cyclohexane or cyclopentane.

Examples of the polycyclic aliphatic cyclic group include groups in which one or two or more hydrogen atoms are eliminated from a polycycloalkane such as bicycloalkane, tricycloalkane, or tetracycloalkane. Specific examples thereof include groups in which one or two or more hydrogen atoms are eliminated from a polycycloalkane such as adamantane, norbornane, isobornane, tricyclodecane, or tetracyclododecane.

Among these groups, a cyclohexyl group, a cyclopentyl group, an adamanthyl group, a norbornyl group, and a tetracyclododecanyl group are preferable in view of industrial availability because of easiness in industrial availability.

Particularly, a constituent unit derived from at least one selected from the following general formulas (11) to (13):

[Chemical Formula 14]

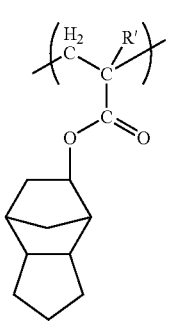

(11)

wherein R' is as defined above,

[Chemical Formula 15]

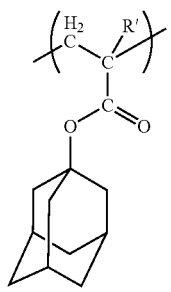

(12)

wherein R' is as defined above, and

[Chemical Formula 16]

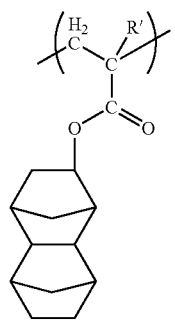

(13)

wherein R' is as defined above, is preferable in view of easiness in industrial availability.

Among these constituent units, a constituent unit represented by the general formula (11) is preferable because the resist pattern is particularly excellent in shape, for example, rectangularity. Also it is preferable in view of suppression of pattern collapse.

These constituent units (a3) may be used alone or in combination.

In the polymer compound of the present invention, the content of the constituent unit (a3) is preferably from 3 to 50 mol %, more preferably from 5 to 35 mol %, and most preferably from 15 to 30 mol %, based on the sum of all constituent units. When the content is the lower limit or more, excellent effects of the present invention are exerted. When the content is the upper limit or less, it is possible to attain a good balance with the other constituent units.

Also the polymer compound of the present invention is preferably a polymer compound comprising at least one of a constituent unit represented by the following general formula (14) and a constituent unit represented by the following general formula (14)' because excellent effects of the present invention are exerted. Also it is preferable because exposed area dependence is improved. Also it is preferable because it has excellent resolution and resist pattern shape even on an inorganic substrate such as SiON substrate.

[Chemical Formula 17]

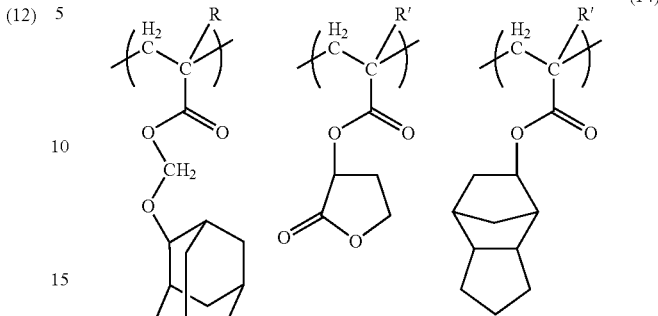

(14)

[Chemical Formula 18]

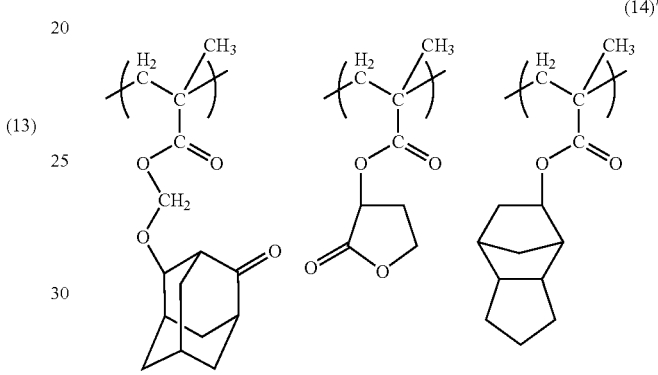

(14)'

<Other Constituent Units>

In the positive photoresist composition of the present invention, as the component (A), acrylic acid derivatives, methacrylic acid derivatives, acrylic acid or methacrylic acid known as a conventional chemically amplified positive resist other than the constituent units (a1) to (a3), known carboxylic acids having an ethylenical double bond used to make it soluble in an alkali, such as maleic acid and fumaric acid, and know monomers used in the preparation of an acrylic resin can be employed by using in combination and copolymerizing, if necessary, as long as the effects of the present invention are not adversely affected.

The polymer compound of the present invention can be obtained, for example, by polymerizing the monomer of each constituent unit through known radical polymerization using a radical polymerization initiator such as azobisisobutyronitrile (AIBN).

The weight average molecular weight (Mw; polystyrene equivalent weight average molecular weight using gel permeation chromatography (GPC), the same shall apply hereinafter) of the polymer compound of the present invention is preferably 30,000 or less, and more preferably 15,000 or less. When the weight average molecular weight is 30,000 or less, there is such a merit that etching resistance is excellent and swelling of a resist pattern is less likely to occur during development, and also pattern collapse is less likely to occur.

The lower limit is not specifically limited, but is preferably 3,000 or more, and more preferably 5,000 or more, taking account of resolution and solubility in an organic solvent.

The dispersion degree is preferably 3.0 or less, and more preferably within a range from 1.0 to 2.5 because resolution and heat resistance are improved.

The polymer compound of the present invention can be composed of one or two or more kinds of polymers.

<Second Aspect: Positive Resist Composition>

The positive resist composition of the present invention comprises a polymer compound of the present invention (hereinafter referred to as a component (A)) as a base material resin component, and an acid generator which generates an acid upon irradiation with radiation (exposure) (hereinafter referred to as a component (B)).

The component (A) comprises a constituent unit (a1) as a constituent unit having a so-called acid dissociable dissolution inhibiting group and is therefore insoluble in an alkali before exposure. When an acid generated from the component (B) effects by exposure, the acid dissociable dissolution inhibiting group is dissociated, and thus the entire component (A) becomes soluble in an alkali. Therefore, when a resist is subjected to selective exposure in the formation of a resist pattern or subjected to post exposure baking (PEB) in addition to the exposure, the exposed area becomes soluble in an alkali-soluble, whereas, the unexposed area is still insoluble in an alkali, and therefore a positive resist pattern can be formed by alkali development.

Component (B)

The component (B) is a so-called acid generator. In the present invention, the component (B) is not specifically limited and a known acid generator used in a conventional chemically amplified photoresist composition can be used.

As the acid generator, there have hitherto been known various acid generators, for example, onium salt-based acid generators such as iodonium salt and sulfonium salt; oxime sulfonate-based acid generators; diazomethane-based acid generators such as bisalkyl or bisarylsulfonyl diazomethanes, poly(bissulfonyl)diazomethanes, and diazomethanenitrobenzyl sulfonates; iminosulfonate-based acid generators; and disulfone-based acid generators.

Specific examples of the onium salt-based acid generators include trifluoromethane sulfonate or nonafluorobutane sulfonate of diphenyliodonium; trifluoromethane sulfonate or nonafluorobutane sulfonate of bis(4-tert-butylphenyl)iodonium; trifluoromethane sulfonate of triphenyl sulfonium, heptafluoropropane sulfonate thereof or nonafluorobutane sulfonate thereof; trifluoromethane sulfonate of tri(4-methylphenyl)sulfonium, heptafluoropropane sulfonate thereof or nonafluorobutane sulfonate thereof; trifluoromethane sulfonate of dimethyl(4-hydroxynaphthyl)sulfonium, heptafluoropropane sulfonate thereof or nonafluorobutane sulfonate thereof; trifluoromethane sulfonate of monophenyldimethyl sulfonium, heptafluoropropane sulfonate thereof or nonafluorobutane sulfonate thereof; trifluoromethane sulfonate of diphenylmonomethyl sulfonium, heptafluoropropane sulfonate thereof or nonafluorobutane sulfonate thereof; trifluoromethane sulfonate of (4-methylphenyl)diphenyl sulfonium, heptafluoropropane sulfonate thereof or nonafluorobutane sulfonate thereof, trifluoromethane sulfonate of (4-methoxyphenyl)diphenyl sulfonium, heptafluoropropane sulfonate thereof or nonafluorobutane sulfonate thereof; and trifluoromethane sulfonate of tri(4-tert-butyl)phenyl sulfonium, heptafluoropropane sulfonate thereof or nonafluorobutane sulfonate thereof.

Among these onium salt-based acid generators, an onium salt having weak acid strength and also having camphorsulfonic acid ions in the anion moiety can be used. Specific examples thereof include compounds represented by the following chemical formula:

[Chemical Formula 19]

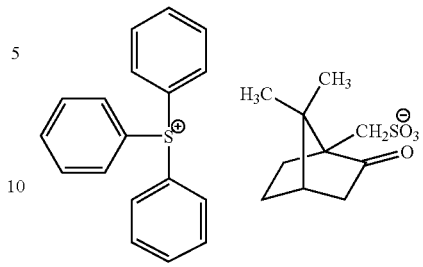

Specific examples of the oxime sulfonate-based acid generators include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl] acetonitrile, α-(tosyloxyimino)-4-thienylcyanide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Among these compounds, α-(methylsulfonyloxyimino)-p-methoxyphenylacetonitrile is preferable.

Specific examples of the bisalkyl or bisarylsulfonyl diazomethanes among the diazomethane-based acid generators include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Examples of poly(bissulfonyl)diazomethanes include 1,3-bis(phenylsulfonyl diazomethylsulfonyl)propane (compound A, decomposition point: 135° C.), 1,4-bis(phenylsulfonyl diazomethylsulfonyl)butane (compound B, decomposition point: 147° C.), 1,6-bis(phenylsulfonyl diazomethylsulfonyl)hexane (compound C, melting point: 132° C., decomposition point: 145° C.), 1,10-bis(phenylsulfonyl diazomethylsulfonyl)decane (compound D, decomposition point: 147° C.), 1,2-bis(cyclohexylsulfonyl diazomethylsulfonyl)ethane (compound E, decomposition point: 149° C.), 1,3-bis(cyclohexylsulfonyl diazomethylsulfonyl)propane (compound F, decomposition point: 153° C.), 1,6-bis(cyclohexylsulfonyl diazomethylsulfonyl)hexane (compound G, melting point: 109° C., decomposition point: 122° C.), and 1,10-bis(cyclohexylsulfonyl diazomethylsulfonyl)decane (compound H, decomposition point: 116° C.), each having the following structures.

[Chemical Formula 20]

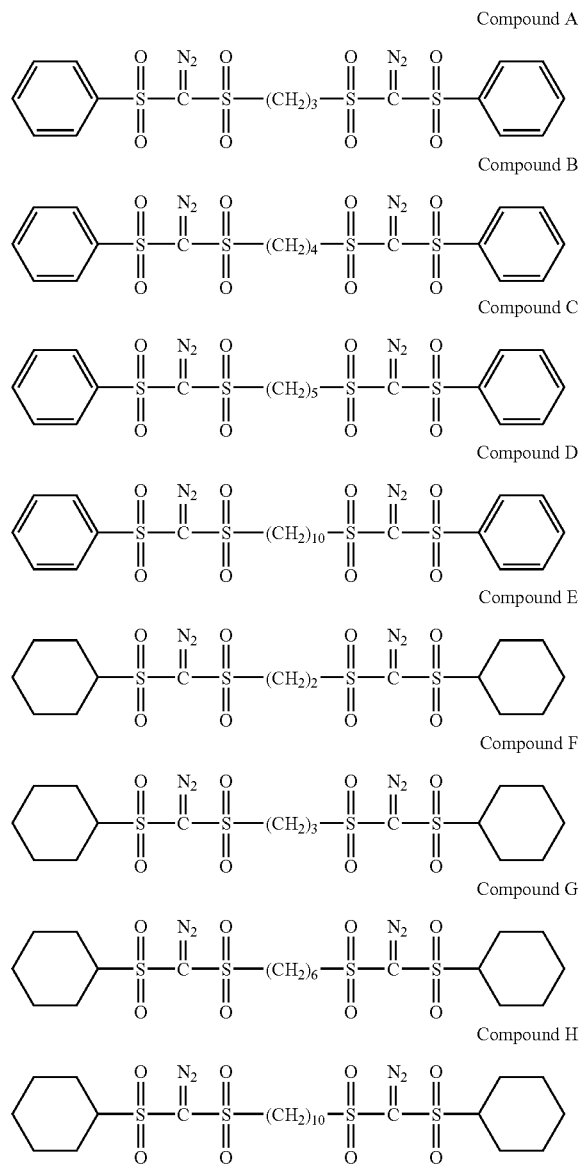

In the present invention, an onium salt having fluorinated alkylsulfonic acid ions as anions is preferably used as the component (B) in view of reactivity with the component (A).

Also acid generators having weak acid strength, for example, diazomethane-based acid generators and acid generators having camphorsulfonic acid ions in the anion moiety can preferably used because the acid dissociable dissolution inhibiting group can be dissociated.

As the component (B), acid generators can be used alone or in combination.

The content of the component (B) is from 0.5 to 30 parts by mass, and preferably from 1 to 10 parts by mass, based on 100 parts by mass of the component (A). When the content is less than the above range, pattern formation may be sufficiently performed. On the other hand, when the content is more than the above range, a uniform solution is less likely to be obtained and thus storage stability may deteriorate.

Component (D)

The positive resist composition of the present invention can be mixed with a nitrogen-containing organic compound (D) (hereinafter referred to as a component (D)) as an optional component so as to improve resist pattern shape and post exposure stability of the latent image formed by the pattern wise exposure of the resist layer (post exposure stability of the latent image formed by the pattern-wise exposure of the resist layer (PED: post exposure delay)).

Since various compounds have already been proposed as this component (D), any compound may be used after selecting from known compounds. Among these compounds, an amine, particularly a secondary lower aliphatic amine and a tertiary lower aliphatic amine are preferable.

As used herein, the lower aliphatic amine means an amine of an alkyl or alkyl alcohol having 5 or less carbon atoms, and examples of the secondary amine and tertiary amine include trimethylamine, diethylamine, triethylamine, di-n-propylamine, tri-n-propylamine, tripentylamine, diethanolamine, triethanolamine, and triisopropanolamine. Among these amines, a tertiary alkanolamine such as triethanolamine or triisopropanolamine is preferable.

These amines may be used alone or in combination.

The component (D) is usually used in the proportion within a range from 0.01 to 5.0 parts by mass based on 100 parts by mass of the component (A).

Component (E)

For the purpose of preventing deterioration of sensitivity due to mixing with the component (D) and improving resist pattern shape and post exposure stability of the latent image formed by the pattern wise exposure of the resist layer (post exposure stability of the latent image formed by the pattern-wise exposure of the resist layer (PED: post exposure delay)), an organic carboxylic acid, or oxo acid of phosphorus or a derivative (E) thereof (hereinafter referred to as a component (E)) can be added as an optional component. The component (D) and the component (E) can be used alone or in combination.

As the organic carboxylic acid, for example, malonic acid, citric acid, malic acid, succinic acid, benzoic acid, and salicylic acid are preferable.

Examples of the oxo acid of phosphorus or the derivative thereof include phosphoric acid or a derivative such as ester thereof, such as phosphoric acid, di-n-butyl phosphoate ester, or phenyl phosphate ester; phosphonic acid or a derivative such as ester thereof, such as phosphonic acid, dimethyl phosphonate ester, di-n-butyl phosphonate ester, phenylphosphonic acid, diphenyl phosphonate ester, or dibenzyl phosphonate ester; and phosphinic acid or a derivative such as ester thereof, such as phosphinic acid or phenylphosphinic acid. Among these, phosphonic acid is particularly preferable.

The component (E) is usually used in the proportion within a range from 0.01 to 5.0 parts by mass based on 100 parts by mass of the component (A).

Other Optional Components

To the positive resist composition of the present invention, if desired, additives having miscibility, for example, additive resins for improving performances of a resist film, surfactants for improving coatability, dissolution inhibitors, plasticizers, stabilizers, colorants, antihalation agents, and dyes can be appropriately added.

Organic Solvent

The positive resist composition of the present invention can be prepared by dissolving materials in an organic solvent.

The organic solvent may be any one which can dissolve the respective components to form a uniform solution, and one or two or more kinds of solvents can be appropriately selected from those which have hitherto been known as a solvent of a chemically amplified photoresist.

Examples of the organic solvent include ketones such as γ-butyrolactone, acetone, methyl ethyl ketone, cyclohexanone, methyl isoamyl ketone, and 2-heptanone; polyhydric alcohols and derivatives thereof, such as ethylene glycol, ethylene glycolmono acetate, diethylene glycol, diethylene glycol monoacetate, propylene glycol, propylene glycol monoacetate, dipropylene glycol, or monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, ethyl methoxypropionate, and ethyl ethoxypropionate.

These organic solvent may be used alone or in combination.

A solvent mixture prepared by mixing propylene glycol monomethyl ether acetate (PGMEA) with a polar solvent is preferable and a mixing ratio (mass ratio) may be appropriately decided taking account of compatibility between PGMEA and the polar solvent, and is preferably within a range from 1:9 to 9:1, and more preferably from 2:8 to 8:2.

More specifically, when mixed with EL as the polar solvent, a mass ratio GMEA:EL is preferably from 2:8 to 8:2, and more preferably from 3:7 to 7:3.

As another organic solvent, a solvent mixture of at least one selected from PGMEA and EL, and γ-butyrolactone is preferable. In this case, a mixing ratio of the former to the latter is preferably from 70:30 to 95:5 in terms of a mass ratio.

The amount of the organic solvent is not specifically limited and is appropriately set according to the thickness of a coating film so as to adjust to the concentration which enables coating on a support such as substrate, and is adjusted so that the solid content of the resist composition is within a range from 2 to 20% by mass, and preferably from 5 to 15% by mass.

<Third Aspect: Process for Forming a Resist Pattern>

A process for forming a resist pattern using the positive resist composition of the present invention can be performed in the following manner.

First, the positive resist composition is coated on a support such as silicon wafer using a spinner, and prebaked under temperature conditions of 80 to 150° C. for 40 to 120 seconds, preferably 60 to 90 seconds, followed by selective exposure (irradiation with radiation) to ArF excimer laser through a desired mask pattern using an ArF aligner and further PEB (post exposure baking) under temperature conditions of 80 to 150° C. for 40 to 120 seconds, preferably 60 to 90 seconds. Then, a development treatment is performed using an alkali developing solution, for example, an aqueous 0.1-10 mass % tetramethylammonium hydroxide solution. Thus, it is possible to obtain a resist pattern which is faithful to the mask pattern ⌐faithful.

It is also possible to provide an organic or inorganic anti-reflective film between the support (substrate) and the coating layer of the resist composition.

The support is not specifically limited and conventionally known supports can be used, and examples thereof include substrate for electronic components, and substrate with a desired wiring pattern formed thereon.

Examples of the substrate include silicon wafer, substrates made of metals such as copper, chromium, iron and aluminum, and glass substrate.

As the material of wiring pattern, for example, copper, solder, chromium, aluminum, nickel, and gold can be used.

Wavelength of light used for exposure (irradiation with radiation) is not specifically limited, and the exposure can be performed using radiations such as ArF excimer laser, KrF excimer laser, $F_2$ excimer laser, EUV (extreme ultraviolet ray), VUV (vacuum ultraviolet ray), EB (electron beam), X-ray, and soft X-ray. The resist composition of the present invention is particularly effective to ArF excimer laser.

As described above, by using the positive resist composition containing the polymer compound of the present invention, it is possible to form a resist pattern having high resolution and high sensitivity in which pattern collapse is suppressed.

Although the reason is not sure, but it is considered that suppression of pattern collapse is attained as a result of an increase of the value of the contact angle due to introduction of a combination of a constituent unit (a1), a constituent unit (a2) and a constituent unit (a3), particularly the constituent unit (a3) in the present invention in comparison with those of the prior art.

It is experimentally confirmed that hydrophobicity is improved and the contact angle to pure water during rinsing is improved by introducing the constituent unit (a3). On the other hand, in a conventional polymer compound for a chemically amplified photoresist composition, when an acid dissociable dissolution inhibiting group composed of an acetal group (alkoxyalkyl group) is introduced, hydrophilicity of the polymer compound is enhanced and thus the contact angle tends to decrease.

Therefore, it is considered that pattern collapse is influenced by the value of a contact angle of the resin.

In the present invention, as described above, it is possible to obtain not only an effect such as suppression of pattern collapse, but also an advantageous effect such as high resolution, high sensitivity and reduction of line edge roughness (LER). LER means un-uniform irregularity of a line side wall.

EXAMPLES

The effects of the present invention will become apparent from the following examples.

First, monomer components used in Synthesis Examples according to Example 1 and Comparative Example 1 are shown below. Abbreviations of the monomer components are described under chemical formulas of the monomer components.

[Chemical Formula 21]

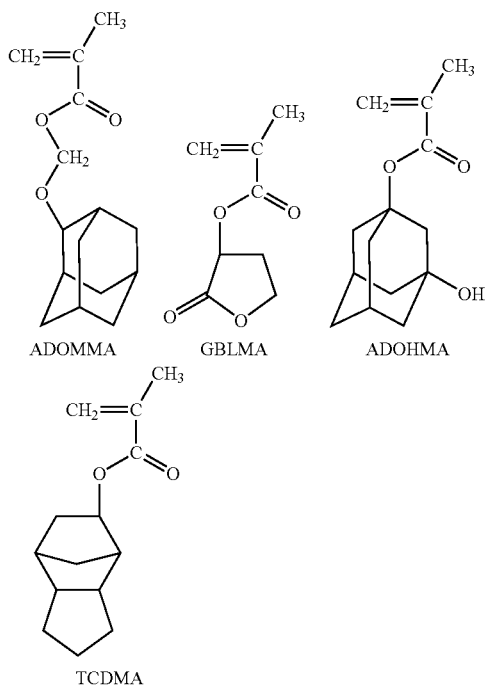

ADOMMA was synthesized by the following procedure.

6.9 g of methacrylic acid was dissolved in 200 mL of tetrahydrofuran and 8.0 g of triethylamine was added. After stirring at room temperature, 100 mL of tetrahydrofuran containing 15 g of 2-adamanthyl chloromethyl ether dissolved therein was added dropwise. After stirring at room temperature for 12 hours, the precipitated salt was removed by filtration. After the solvent in the resulting filtrate was distilled off, the filtrate was dissolved in 200 mL of ethyl acetate and washed with pure water (100 mL×3) and then the solvent was distilled off. After standing under ice cooling, a white solid was obtained.

With respect to the product, infrared absorption spectrum (IR) and proton nuclear magnetic resonance spectrum ($^1$H-NMR) were measured. The results are shown below.

IR (cm$^{-1}$): 2907, 2854 (C—H stretching), 1725 (C—O stretching), 1638 (C=C stretching) $^1$H-NMR (CDCl$_3$, internal standard: tetramethylsilane) ppm: 1.45 to 2.1 (m, 17H), 3.75 (s, 1H), 5.45 (s, 2H), 5.6 (s, 1H), 6.12 (s, 1H)

Synthesis Example 1

20.0 g of ADOMMA, 13.6 g of GBLMA and 8.8 g of TCDMA were dissolved in 200 ml of tetrahydrofuran (THF) and 1.64 g of azobisisobutyronitrile (AIBN) was added and, after refluxing for 12 hours, the reaction solution was added dropwise in 2 L of n-heptane.

The precipitated resin was collected by filtration and dried under reduced pressure to obtain a white powdered resin. This resin is referred to as a resin 1.

This resin 1 comprises a constituent unit represented by the following chemical formula.

[Chemical Formula 22]

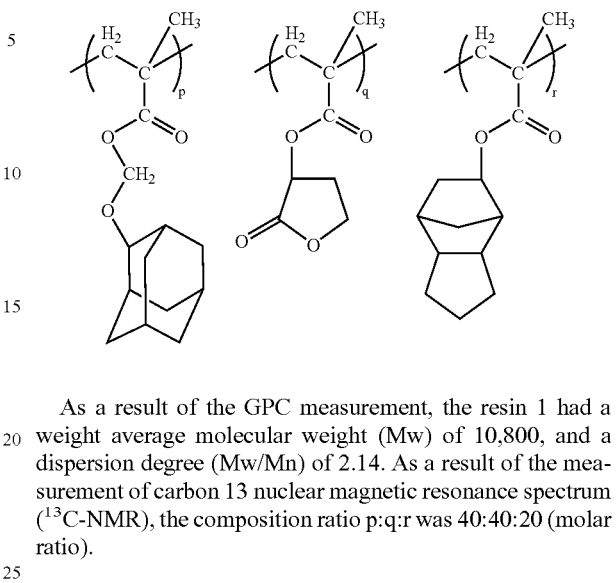

As a result of the GPC measurement, the resin 1 had a weight average molecular weight (Mw) of 10,800, and a dispersion degree (Mw/Mn) of 2.14. As a result of the measurement of carbon 13 nuclear magnetic resonance spectrum ($^{13}$C-NMR), the composition ratio p:q:r was 40:40:20 (molar ratio).

Synthesis Example 2

20.0 g of ADOMMA, 13.6 g of GBLMA and 9.5 g of ADOHMA were dissolved in 200 ml of tetrahydrofuran (THF) and 1.64 g of azobisisobutyronitrile (AIBN) was added and, after refluxing for 12 hours, the reaction solution was added dropwise in 2 L of n-heptane.

The precipitated resin was collected by filtration and dried under reduced pressure to obtain a white powdered resin. This resin is referred to as a resin 2.

This resin 2 comprises a constituent unit represented by the following chemical formula.

[Chemical Formula 23]

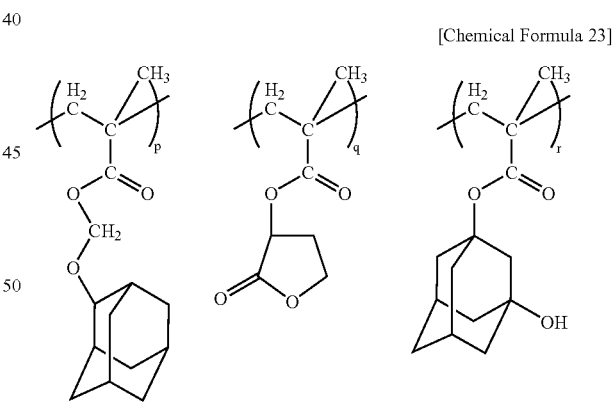

As a result of the GPC measurement, the resin 2 had a weight average molecular weight (Mw) of 9,700, and a dispersion degree (Mw/Mn) of 1.88. As a result of the measurement of carbon 13 nuclear magnetic resonance spectrum ($^{13}$C-NMR), the composition ratio p:q:r was 40:40:20 (molar ratio).

Example 1 and Comparative Example 1

According to the formulations shown in Table 1 below, positive resist compositions were prepared.

TABLE 1

| | (A) Resin | (B) Acid generator TPS-PFBS | Nitrogen-containing organic compound Triethanolamine | Organic solvent PGMFA/EL (Parts by mass) |
|---|---|---|---|---|
| | Resin 1 | | | |
| Example 1 | 100 Parts by mass | 3.5 Parts by mass | 0.35 Parts by mass | = 6/4 750 Parts by mass |
| | Resin 2 | | | |
| Comparative Example 1 | 100 Parts by mass | 3.5 Parts by mass | 0.35 Parts by mass | = 6/4 750 Parts by mass |

TPS-PFBS: Triphenylsulfonium nonafluorobutanesulfonate

Then, an organic antireflective film composition "ARC-29A" (trade name, manufactured by Brewer Science Co.) was coated on a 8 inch silicon wafer using a spinner and then dried by baking on a hot plate at 215° C. for 60 seconds to form an organic antireflective film having a thickness of 77 nm.

The positive resist composition obtained above was coated on the antireflective film using a spinner and then dried by prebaking (PAB) on a hot plate at 95° C. for 90 seconds to form a resist film having a thickness of 225 nm.

Then, the resist film was selectively irradiated with ArF excimer laser (193 nm) through a mask pattern (binary mask) using an ArF aligner NSR-S302 (manufactured by Nikon Corporation; NA (numerical aperture)=0.60, ⅔ annular zone illumination).

The exposed resist film was PEB treated under the conditions of 105° C. for 90 seconds, paddle developed with an aqueous solution 2.38 mass % tetramethylammonium hydroxide (TMAH) solution at 23° C. for 60 seconds, washed with water for 20 seconds and then dried.

Various physical properties of the positive resist composition were determined by the following procedures. A contact angle was measured by using a solution of a polymer compound (resin 1, resin 2) without using the component (B).

<Sensitivity>

An exposure time at which line-and-space of 140 nm is formed at a ratio of 1:1 was measured as sensitivity (EOP) in a unit of mJ/cm$^2$ (energy amount).

<Limiting Resolution>

Limiting resolution in EOP was judged by SEM micrographs.

<Pattern Collapse>

As the exposure time in selective exposure increases, pattern becomes thinner, thus causing pattern collapse. The process of the occurrence of pattern collapse was observed by SEM. The results are indicated by the size of the width of the pattern at which pattern collapse occurs.

<Contact Angle>

The contact angle was measured using a FACE contact angle meter, Model CA-X150 (trade name, manufactured by Kyowa Interface Science Co., Ltd.).

The measuring method is as follows. Namely, on a 8 inch silicon wafer, a solution prepared by dissolving each polymer compound (resin 1, resin 2) used in the respective Examples or Comparative Examples in 750 parts by mass of a solvent mixture of propylene glycol monomethyl ether acetate and ethyl lactate in a mass ratio of 6:4 was coated and heated at 95° C. for 90 seconds to form a resist film having a thickness of 225 nm. Then, the polymer film was brought into contact with a syringe with which the contact angle meter is equipped (2 μL of pure water is dropped when the syringe is brought into contact with the polymer film) and the contact angle was measured.

The evaluation results are shown in Table 2.

TABLE 2

| | Sensitivity | Limiting resolution | Pattern collapse | Contact angle |
|---|---|---|---|---|
| Example 1 | 16 mJ/cm$^2$ | 110 nm | 71 nm | 55.7° |
| Comparative Example 1 | 19 mJ/cm$^2$ | 130 nm | 102 nm | 44.2° |

Then, Synthesis Examples according to Example 2 are shown below.

Synthesis Example 3

2.2 g of methacrylic acid was dissolved in 50 mL of tetrahydrofuran and 2.5 g of triethylamine was added. After stirring at room temperature, 50 mL of tetrahydrofuran containing 4.3 g of 4-oxo-2-adamanthyl chloromethyl ether dissolve therein was added dropwise. After stirring at room temperature for 12 hours, the precipitated salt was removed by filtration. After the solvent in the resulting filtrate was distilled off, the filtrate was dissolved in 100 mL of ethyl acetate and washed with pure water (50 mL×3) and then the solvent was distilled off. After standing under ice cooling, a white solid was obtained. This compound is referred to as OADOMMA and is represented by the following chemical formula. Infrared absorption spectrum (IR) and proton nuclear magnetic resonance spectrum ($^1$H-NMR) were measured. The results are shown below.

IR (cm$^{-1}$): 2926, 2861 (C—H stretching)), 1725 (C=O stretching), 1636 (C=C stretching) $^1$H-NMR (CDCl$_3$, internal standard: tetramethylsilane) ppm: 1.62 to 3.85 (m, 15H), 4.2 (s, 1H), 5.4 (s, 2H), 5.65 (s, 1H), 6.15 (s, 1H)

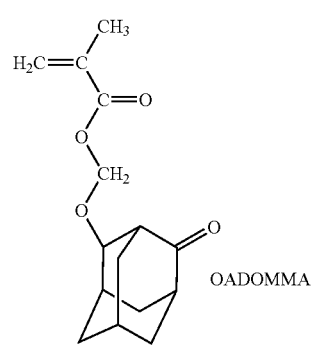

[Chemical Formula 24]

OADOMMA

Synthesis Example 4

21.0 g of OADOMMA, 13.6 g of GBLMA and 8.8 g of TCDMA were dissolved in 200 ml of tetrahydrofuran (THF) and 1.64 g of azobisisobutyronitrile (AIBN) was added and, after refluxing for 12 hours, the reaction solution was added dropwise in 2 L of n-heptane. The precipitated resin was collected by filtration and dried under reduced pressure to obtain a white powdered resin. This resin is referred to as a resin 3. This resin 3 comprises a constituent unit represented by the following chemical formula.

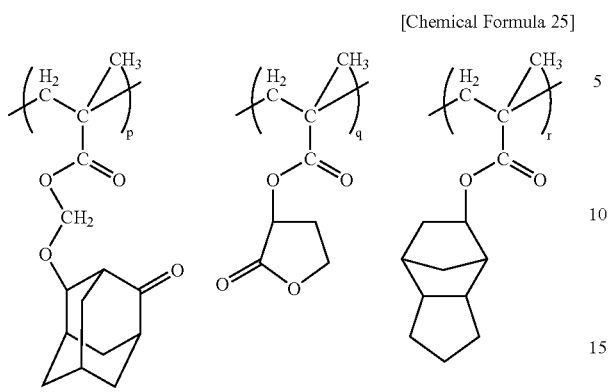

[Chemical Formula 25]

As a result of the GPC measurement, the resin 3 had a weight average molecular weight (Mw) of 9,800, and a dispersion degree (Mw/Mn) of 1.74. As a result of the measurement of carbon 13 nuclear magnetic resonance spectrum ($^{13}$C-NMR), the composition ratio p:q:r was 40:40:20 (molar ratio).

Example 2

In the same manner as in Example 1, except that the resin 1 is replaced by the resin 3 in Example 1, a positive resist composition was prepared and a resist pattern was formed in the same manner. The sensitivity was 20 mJ/cm$^2$, limiting resolution was 110 nm, and pattern collapse was 47 nm.

<Evaluation of Line Edge Roughness (LER)>

A line width of the resist patterns formed in Examples 1 to 2 and Comparative Example 1 was measured at 5 points in a longitudinal direction of the line using a length measuring SEM (manufactured by Hitachi, Ltd. under the trade name of S-9220). From the results, 3-fold value (3σ) of standard deviation (σ) was calculated as an indicator which indicates LER. Smaller value of 3σ means that a resist pattern having smaller roughness (unevenness, irregularity) of the line width and more uniform width is obtained.

As a result, the value of 3σ was 3.5 nm in Example 1, 3.2 nm in Example 2, or 6.3 nm in Comparative Example 1.

As is apparent from the above results, the resist patterns obtained by using the positive resist compositions of Example 1 and Example 2 have excellent resolution and excellent sensitivity and also pattern collapse and LER were suppressed.

In Example 1, constituent units corresponding to the constituent unit (a1), the constituent unit (a2) and the constituent unit (a3) are used. In Comparative Example 1, the resin 2, in which the constituent unit (a3) is replaced by a constituent unit having a polar group in the polymer compound (resin 1) used in Example 1, is used. It could be confirmed that the contact angle is higher in the case of the resin 1 used in Example 1.

INDUSTRIAL APPLICABILITY

The resent invention can be applied to a polymer compound capable of forming a resist pattern, a positive resist composition containing the polymer compound, and a process for forming a resist pattern.

The invention claimed is:

1. A polymer compound comprising:
a constituent unit (a1) represented by the following general formula (1):

[Chemical Formula 1]

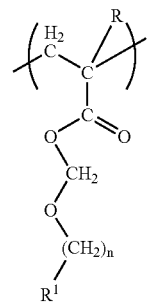

(1)

wherein R represents a hydrogen atom, a fluorine atom, a lower alkyl group having 20 or less carbon atoms, or a fluorinated lower alkyl group having 20 or less carbon atoms, R$^1$ represents at most 20-membered cyclic group which may have a substituent, and n represents 0 or an integer of 1 to 5,
a constituent unit (a2) derived from an (α-alkyl of 1 to 5 carbon atoms) acrylate ester having a lactone-containing monocycle or a polycyclic group, and
a constituent unit (a3) which is a constituent unit other than the constituent unit (a1) and the constituent unit (a2) and is derived from an (α-alkyl of 1 to 5 carbon atoms) acrylate ester which has an aliphatic cyclic group-containing non-acid dissociable dissolution inhibiting group and does not have a polar group,
wherein the constituent unit (a2) is a constituent unit represented by the following general formula (5):

[Chemical Formula 4]

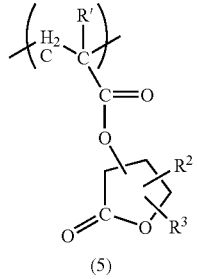

(5)

wherein R' represents an alkyl group of 1 to 5 carbon atoms or a hydrogen atom, and R$^2$ and R$^3$ each independently represents a hydrogen atom or an alkyl group of 1 to 5 carbon atoms.

2. The polymer compound according to claim 1, wherein the constituent unit (a1) is a constituent unit represented by the following general formula (2):

[Chemical Formula 3]

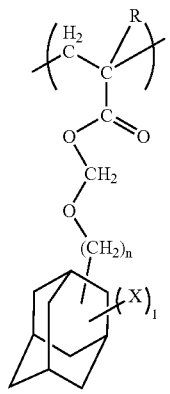

(2)

wherein R and n are as defined above, X represents a polar group, and l represents 0 or an integer of 1 to 3.

3. The polymer compound according to claim 1, wherein the constituent unit (a3) is a constituent unit represented by the following general formula (10):

[Chemical Formula 5]

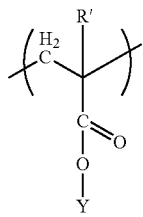

(10)

wherein R' represents a hydrogen atom or an alkyl group of 1 to 5 carbon atoms, Y represents an aliphatic cyclic group whose basic ring has 4 to 15 carbon atoms, and wherein the aliphatic cyclic group may have 1 to 3 alkyl groups having 1 to 10 carbon atoms as substituents to be attached to the basic ring.

4. The polymer compound according to claim 3, wherein the constituent unit (a3) is at least one constituent unit selected from constituent units represented by the following general formulas (11) to (13):

[Chemical Formula 6]

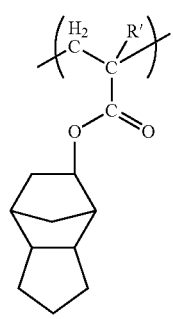

(11)

wherein R' is as defined above,

[Chemical Formula 7]

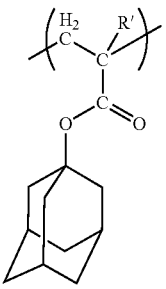

(12)

wherein R' is as defined above, and

[Chemical Formula 8]

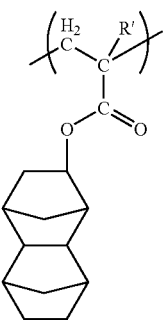

(13)

wherein R' is as defined above.

5. The polymer compound according to claim 4, comprising at least one of:

a combination of constituent units represented by the following general formula (14) and a combination of constituent units represented by the following general formula (14)':

[Chemical Formula 9]

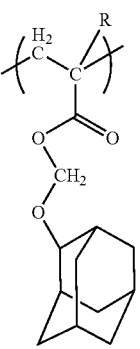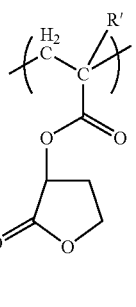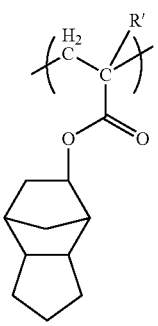

(14)

wherein R, and R' are as defined above, and

[Chemical Formula 10]

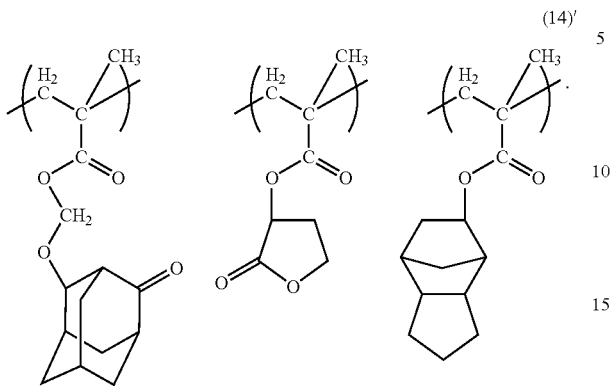

(14)'

6. A positive resist composition comprising a base material resin component (A), the alkali solubility of which varies under action of an acid, and an acid generator (B) which generates an acid upon irradiation with radiation, wherein the base material resin component (A) is the polymer compound of claim 1.

7. The positive resist composition according to claim 6, further comprising a nitrogen-containing organic compound (D).

8. A process for forming a resist pattern comprising:

forming a resist film on a substrate using the positive resist composition of claim 6;

exposing the resist film; and developing the resist film to form a resist pattern.

9. A polymer compound comprising:

a constituent unit (a1) represented by the following general formula (1)':

[Chemical Formula 2]

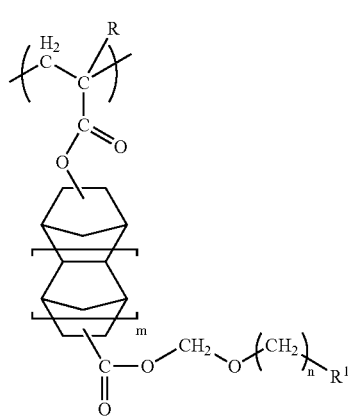

(1)' wherein R represents a hydrogen atom, a fluorine atom, a lower alkyl group having 20 or less carbon atoms, or a fluorinated lower alkyl group having 20 or less carbon atoms, $R^1$ represents at most 20-membered cyclic group which may have a substituent, n represents 0 or an integer of 1 to 5, and m represents 0 or 1, a constituent unit (a2) derived from an (α-alkyl of 1 to 5 carbon atoms) acrylate ester having a lactone-containing monocycle or a polycyclic group, and a constituent unit (a3) which is a constituent unit other than the constituent unit (a1) and the constituent unit (a2) and is derived from an (α-alkyl of 1 to 5 carbon atoms) acrylate ester which has an aliphatic cyclic group-containing non-acid dissociable dissolution inhibiting group and does not have a polar group.

10. The polymer compound according to claim 9, wherein the constituent unit (a2) is a constituent unit represented by the following general formula (5):

[Chemical Formula 4]

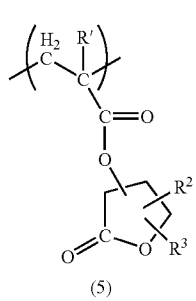

(5)

wherein R' represents an alkyl group of 1 to 5 carbon atoms or a hydrogen atom, and $R^2$ and $R^3$ each independently represents a hydrogen atom or an alkyl group of 1 to 5 carbon atoms.

11. The polymer compound according to claim 9, wherein the constituent unit (a3) is a constituent unit represented by the following general formula (10):

[Chemical Formula 5]

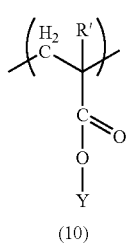

(10)

wherein R' represents a hydrogen atom or an alkyl group of 1 to 5 carbon atoms, Y represents an aliphatic cyclic group whose basic ring has 4 to 15 carbon atoms, and wherein the aliphatic cyclic group may have 1 to 3 alkyl groups having 1 to 10 carbon atoms as substituents to be attached to the basic ring.

12. The polymer compound according to claim 11, wherein the constituent unit (a3) is at least one constituent unit selected from constituent units represented by the following general formulas (11) to (13):

[Chemical Formula 6]

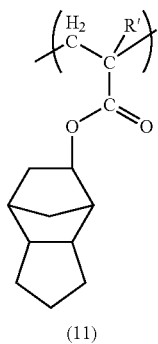

(11)

wherein R' is as defined above,

[Chemical Formula 7]

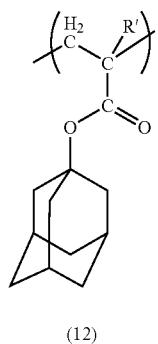

(12)

wherein R' is as defined above, and

[Chemical Formula 8]

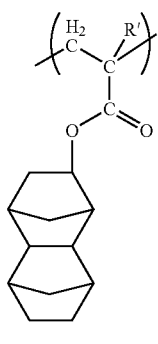

(13)

wherein R' is as defined above.

13. A positive resist composition comprising a base material resin component (A), the alkali solubility varies under action of an acid, and an acid generator (B) which generates an acid upon irradiation with radiation, wherein
the base material resin component (A) is the polymer compound of claim 9.

14. The positive resist composition according to claim 13, further comprising a nitrogen-containing organic compound (D).

15. A process for forming a resist pattern comprising: forming a resist film on a substrate using the positive resist composition of claim 13; exposing the resist film; and developing the resist film to form a resist pattern.

16. A polymer compound comprising:
a constituent unit (a1) represented by the following general formula (1):

[Chemical Formula 1]

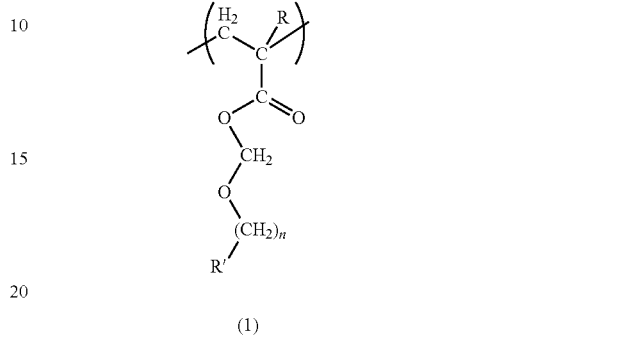

(1)

wherein R represents a hydrogen atom, a fluorine atom, a lower alkyl group having 20 or less carbon atoms, or a fluorinated lower alkyl group having 20 or less carbon atoms, $R^1$ represents at most 20-membered cyclic group which may have a substituent, and n represents 0 or an integer of 1 to 5, a constituent unit (a2) derived from an (α-alkyl of 1 to 5 carbon atoms)acrylate ester having a lactone-containing monocycle or a polycyclic group, and a constituent unit (a3) which is a constituent unit other than the constituent unit (a1) and the constituent unit (a2) and is derived from an (α-alkyl of 1 to 5 carbon atoms) acrylate ester which has an aliphatic cyclic group-containing non-acid dissociable dissolution inhibiting group and does not have a polar group;

wherein the constituent unit (a1) is a constituent unit represented by the following general formula (2):

[Chemical Formula 3]

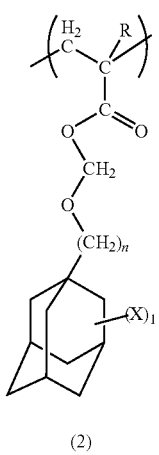

(2)

wherein R and n are as defined above, X represents a polar group, and 1 represents 0 or an integer of 1 to 3.

17. The polymer compound according to claim 16, wherein the constituent unit (a3) is a constituent unit represented by the following general formula (10):

[Chemical Formula 5]

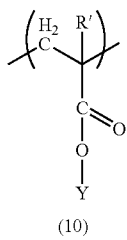

(10)

wherein R' represents a hydrogen atom or an alkyl group of 1 to 5 carbon atoms; and Y represents an aliphatic cyclic group whose basic ring has 4 to 15 carbon atoms, and the aliphatic cyclic group may have 1 to 3 alkyl groups having 1 to 10 carbon atoms as substituents to be attached to the basic ring.

18. A positive resist composition comprising a base material resin component (A), the alkali solubility of which varies under action of an acid, and an acid generator (B) which generates an acid upon irradiation with radiation, wherein
the base material resin component (A) is the polymer compound of claim 16.

19. A process for forming a resist pattern comprising: forming a resist film on a substrate using the positive resist composition of claim 18; exposing the resist film; and developing the resist film to form a resist pattern.

* * * * *